(12) United States Patent
Qiu et al.

(10) Patent No.: US 8,365,208 B2
(45) Date of Patent: Jan. 29, 2013

(54) OPTICAL DISK PLAYER

(75) Inventors: Ji-Feng Qiu, Shenzhen (CN); Hong Li, Shenzhen (CN); Xiao-Hui Zhou, Shenzhen (CN); Ping Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 52 days.

(21) Appl. No.: 13/205,654

(22) Filed: Aug. 9, 2011

(65) Prior Publication Data
US 2012/0331492 A1    Dec. 27, 2012

(30) Foreign Application Priority Data
Jun. 24, 2011    (CN) .......................... 2011 1 0173046

(51) Int. Cl.
*G11B 33/02*    (2006.01)
(52) U.S. Cl. ...................................................... 720/647
(58) Field of Classification Search ................... 720/647
See application file for complete search history.

(56) References Cited

U.S. PATENT DOCUMENTS

| | | | | |
|---|---|---|---|---|
| 7,409,696 B2* | 8/2008 | Dai | ............................... | 720/657 |
| 7,495,712 B2* | 2/2009 | Takeda | ........................... | 348/836 |
| 7,770,191 B2* | 8/2010 | Tamura | ......................... | 720/647 |
| 7,886,316 B2* | 2/2011 | Iwai et al. | ..................... | 720/647 |
| 8,056,096 B2* | 11/2011 | Lai et al. | ....................... | 720/647 |
| 2006/0271944 A1* | 11/2006 | Wang et al. | ................... | 720/644 |

* cited by examiner

*Primary Examiner* — Mark Blouin
(74) *Attorney, Agent, or Firm* — Altis Law Group, Inc.

(57) ABSTRACT

An optical disk player includes a main body, a cover engaging with the main body, a pivot module, and a deceleration module. The pivot module includes a torsion spring, two ends of the torsion spring being fixed on the main body and the cover respectively. The deceleration module includes a first deceleration portion arranged on the main body and a second deceleration portion arranged on the pivot module. The first deceleration portion contacts the second deceleration portion and frictional forces therebetween reduces the speed of opening the cover.

16 Claims, 8 Drawing Sheets

OPTICAL DISK PLAYER

BACKGROUND

1. Technical Field

The present disclosure relates to optical disk players and, more particularly, to an optical disk player with a deceleration module.

2. Description of Related Art

Optical disk players, such as DVD (digital versatile disk) players etc., are widely used. An optical disk player includes a main body for receiving an optical disk, a cover pivotably connected to the main body, and a torsion spring arranged between the main body and the cover. The cover can automatically open because of the torsion spring. However, an opening speed of the cover may be too quick because of excessive force of the torsion spring; therefore, the cover is easily damaged over time, and a lifespan of the optical disk player will be reduced.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
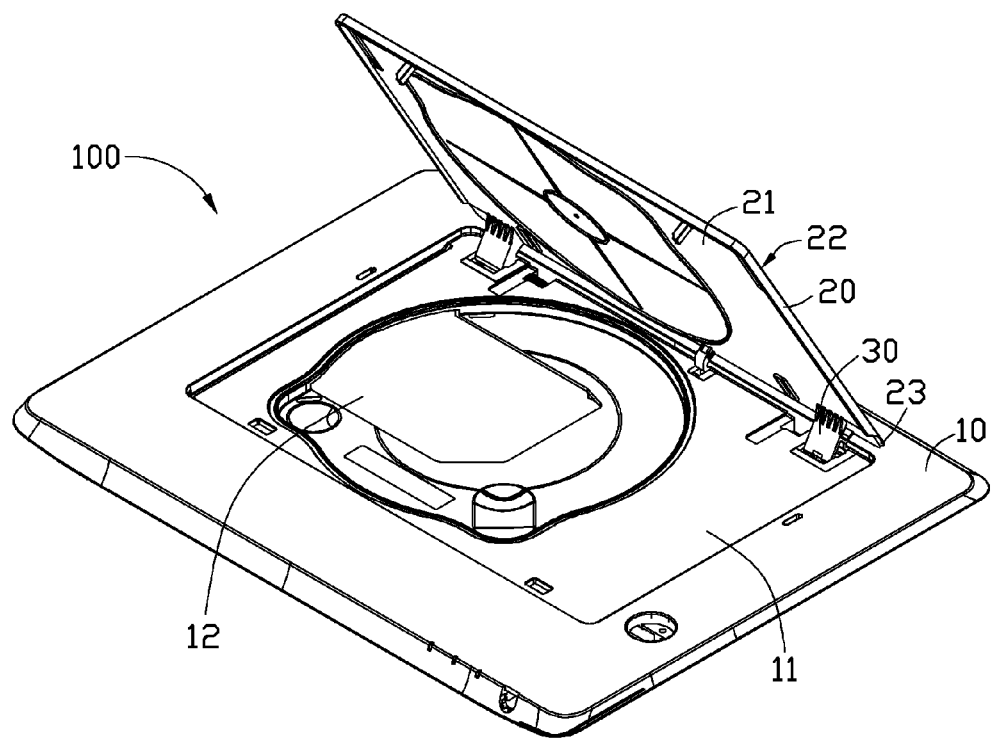
FIG. 1 is a schematic, isometric view of an optical disk player with a cover thereof opened according to an exemplary embodiment.
Figure 2:
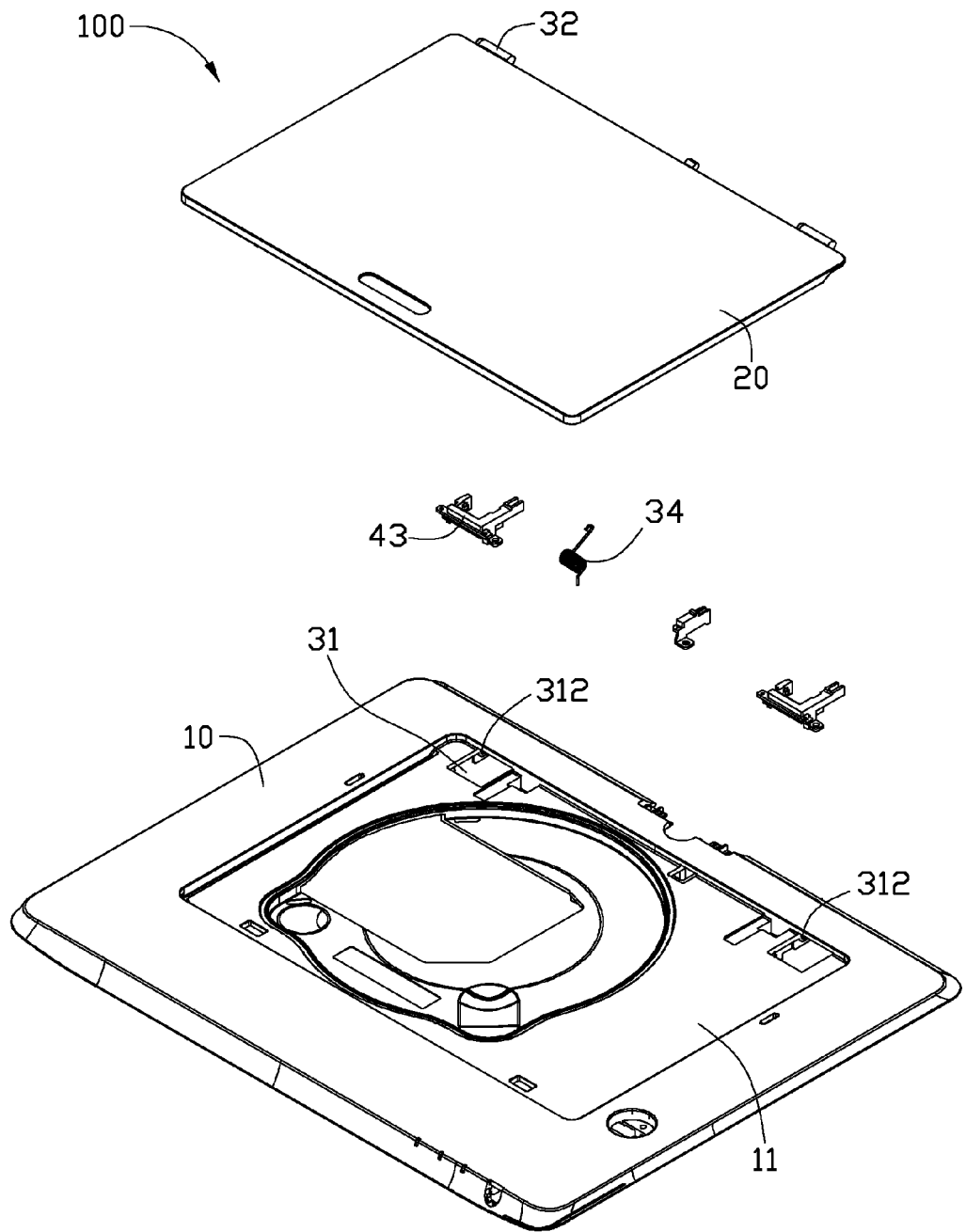
FIG. 2 is a partially exploded, isometric view of the optical disk player of FIG. 1.
Figure 3:
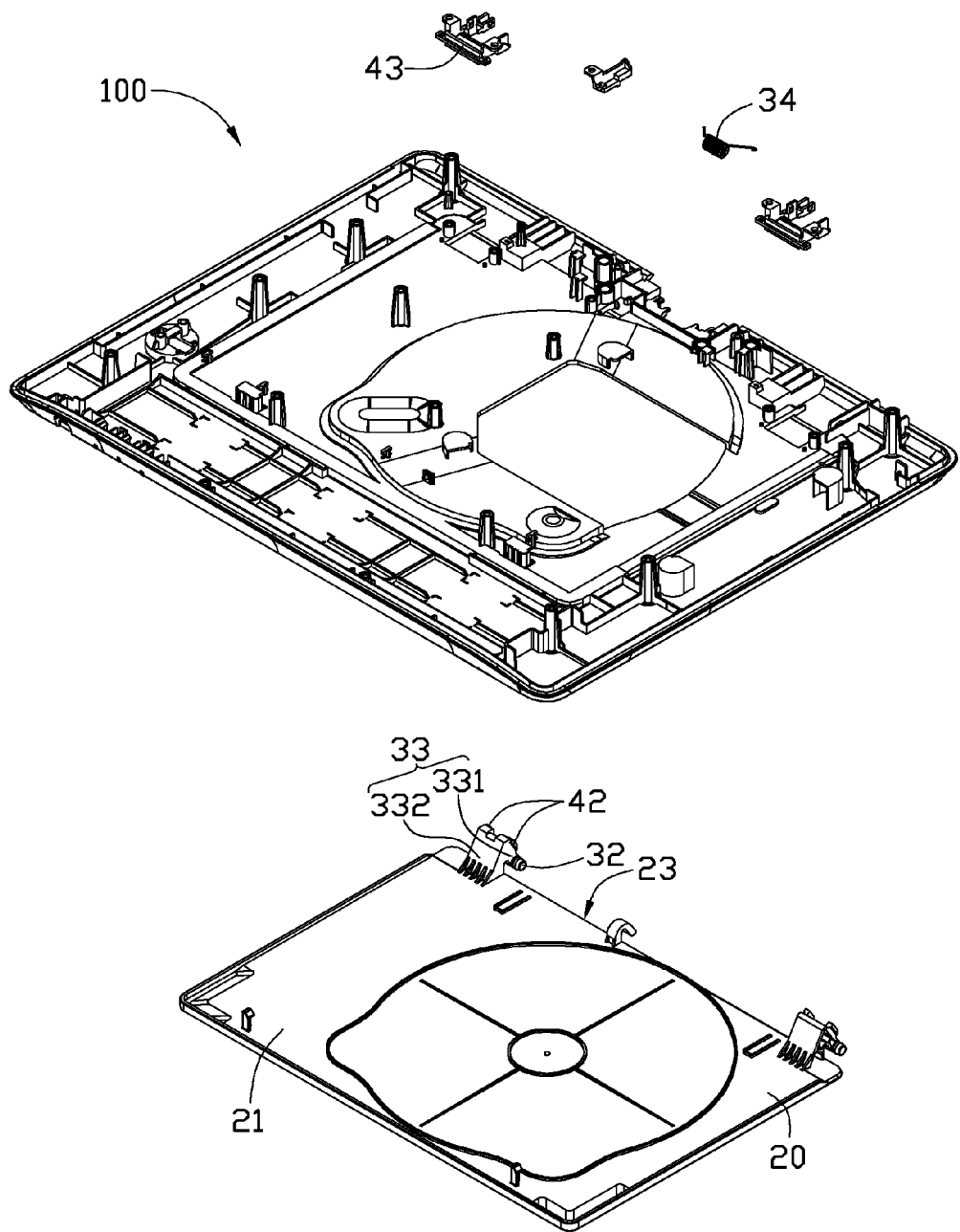
FIG. 3 is an inverted view of the optical disk player of FIG. 2.
Figure 4:
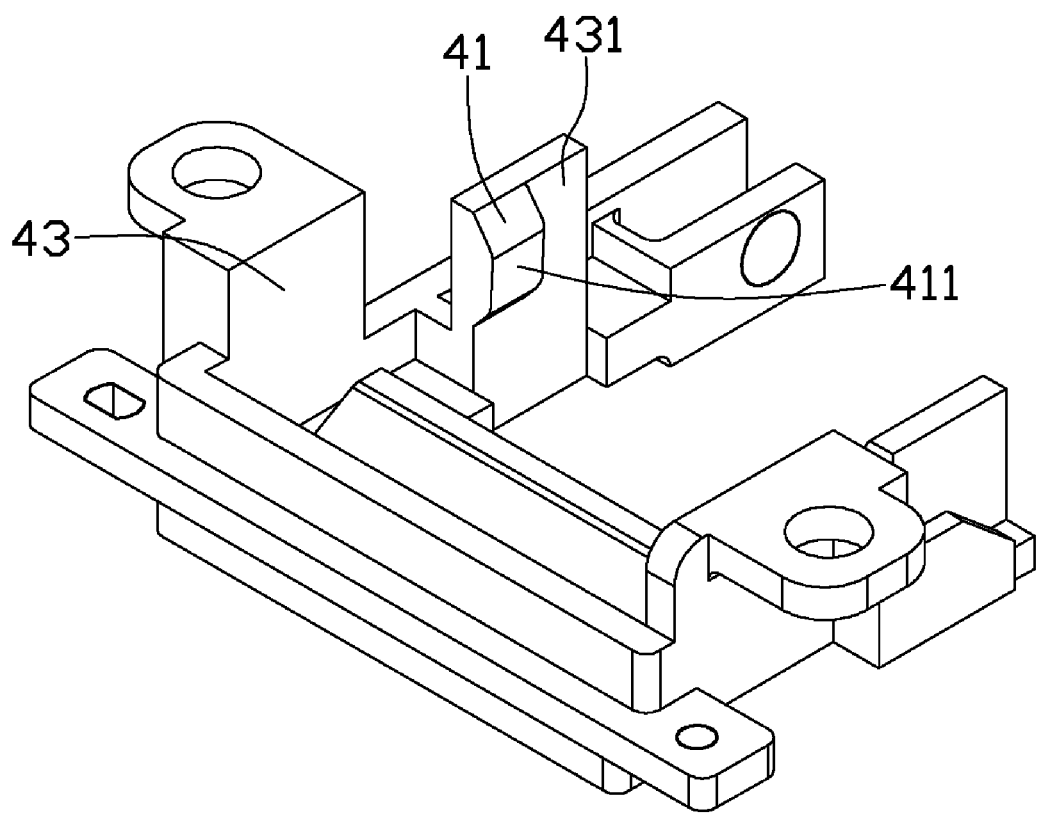
FIG. 4 is an enlarged view of a holder of the optical disk player of FIG. 3.
Figure 5:
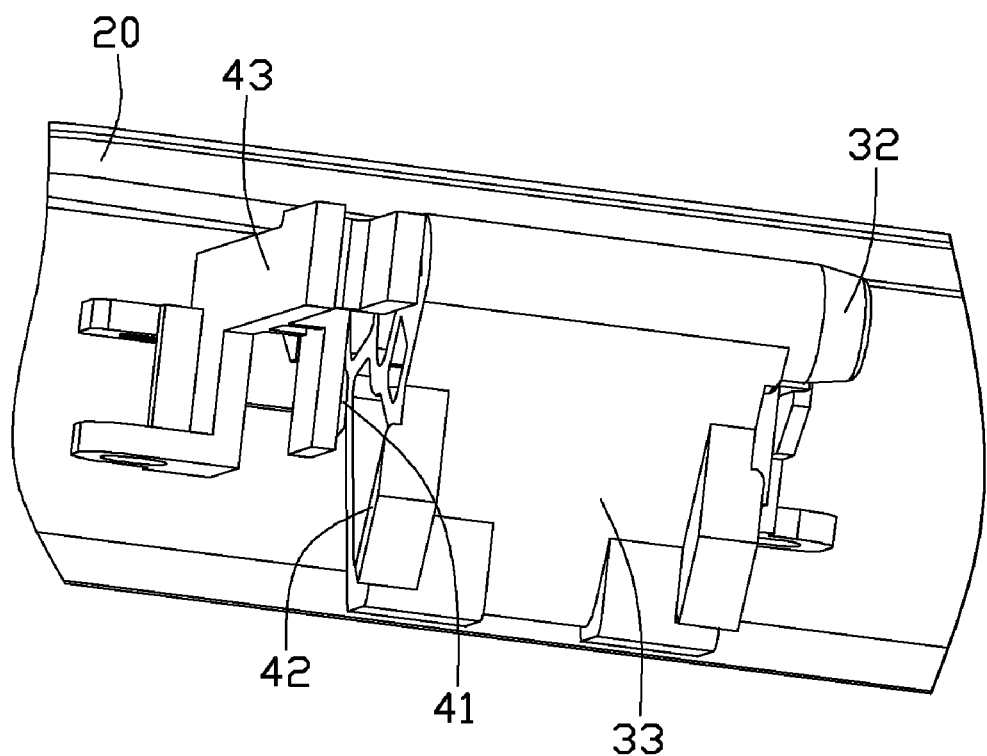
FIG. 5 is a partial, isometric view of the optical disk player of FIG. 1 when the cover is closed.
Figure 6:
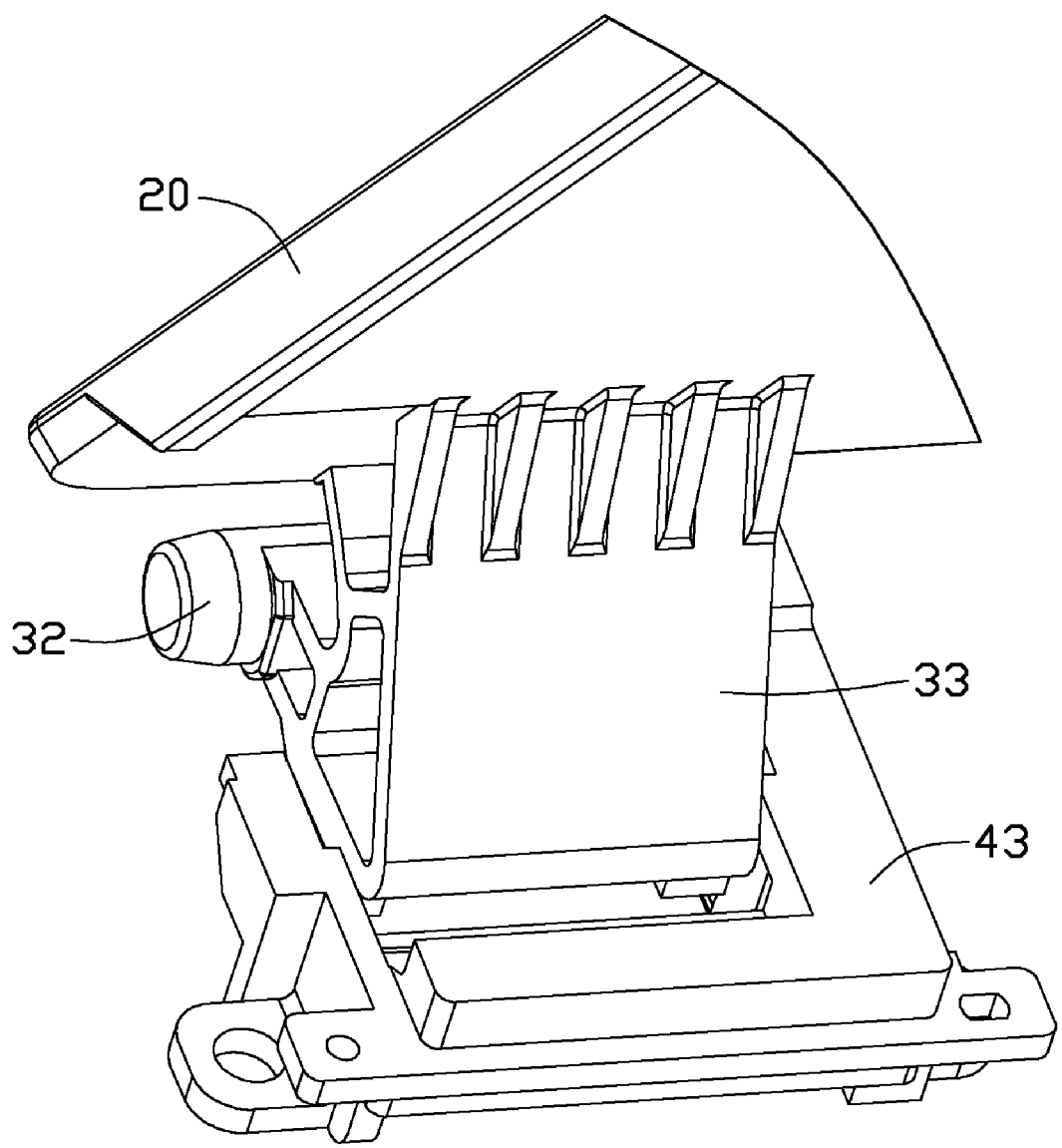
FIG. 6 is a partial, isometric view of the optical disk player of FIG. 1 when the cover is opened at a predetermined angle.
Figure 7:
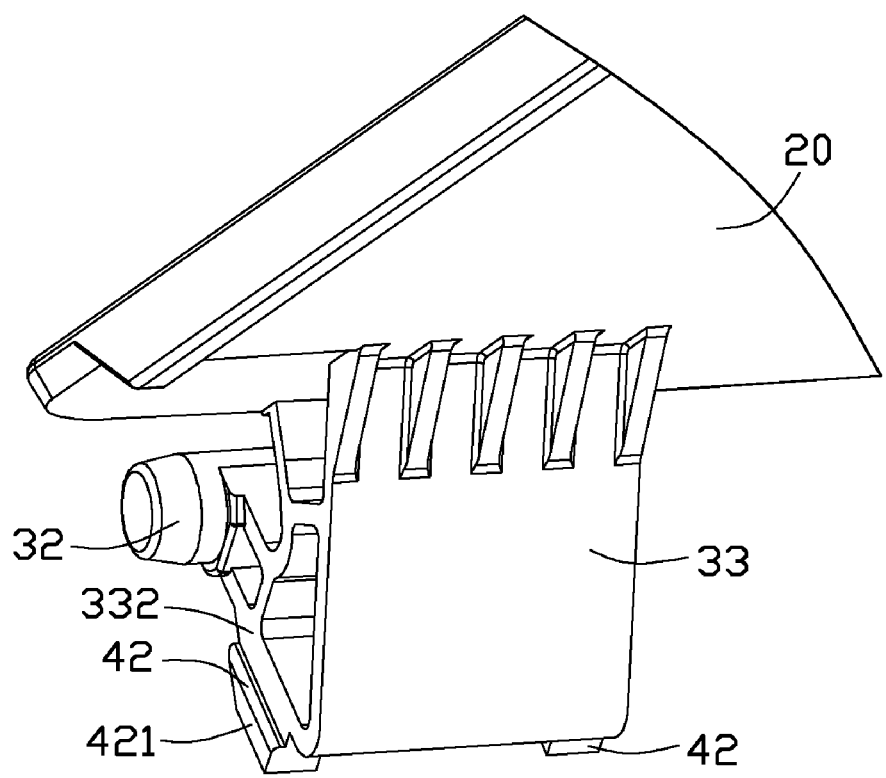
FIG. 7 is an exploded view of the optical disk player of FIG. 6.
Figure 7:
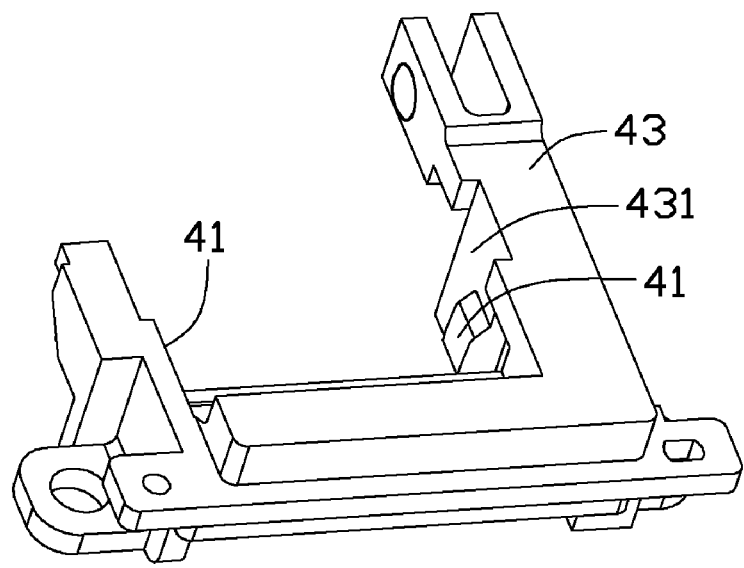
Figure 8:
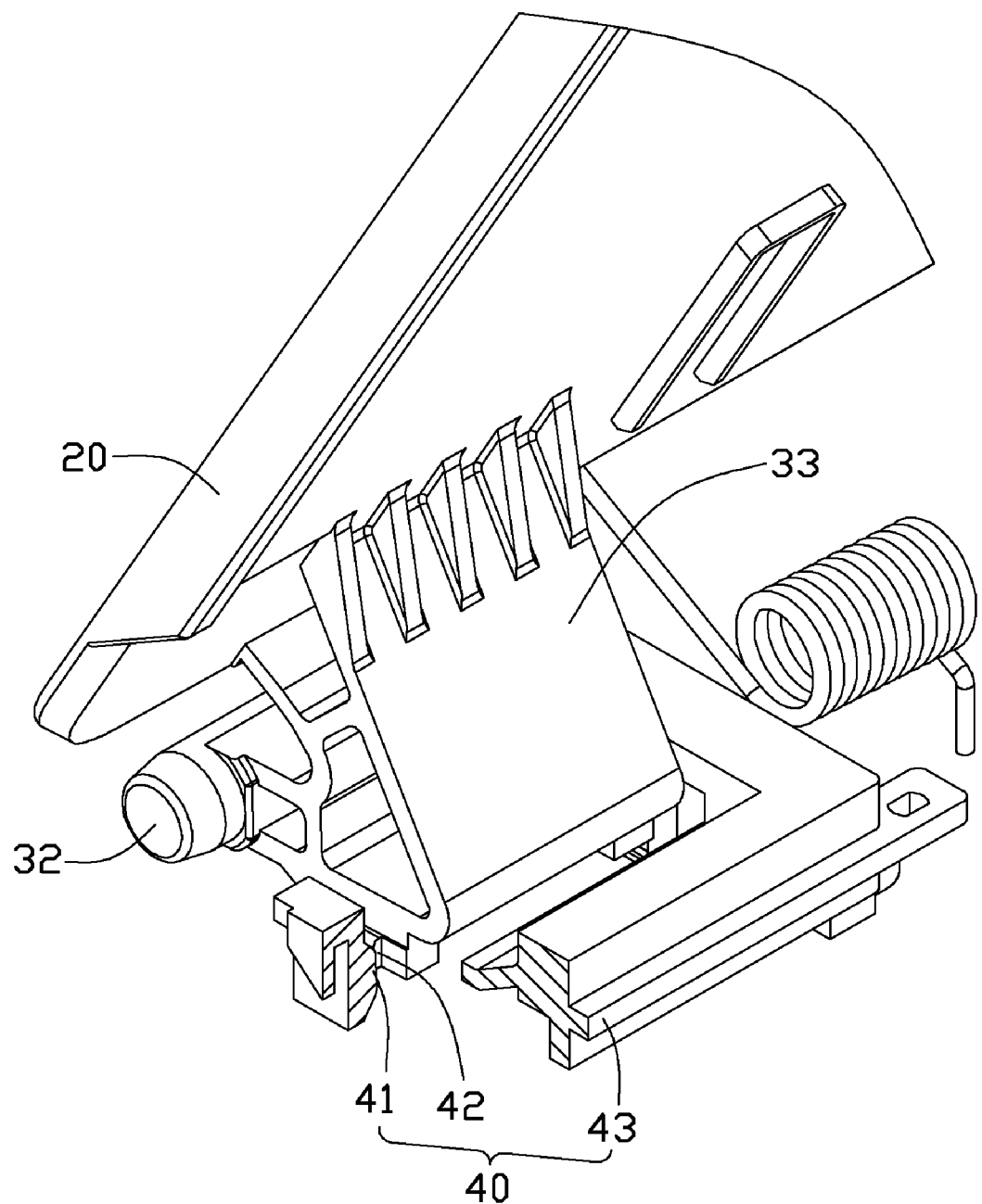
FIG. 8 is a partial, cross-sectional view of the optical disk player of FIG. 6.

Referring to FIGS. 1 to 4, an optical disk player 100 according to an exemplary embodiment is shown. The optical disk player 100 includes a main body 10, a cover 20, two pivot modules 30, and two deceleration modules 40 (see FIG. 8). The optical disk player 100 can be a DVD player, a CD (compact disk) player, a VCD (video compact disk) player etc. In the present embodiment, the optical disk player 100 is a DVD player.

The main body 10 includes a top surface 11 and a bottom surface opposite to the top surface 11. The main body 10 includes a chassis 12 on a center of the top surface 11 thereof. An optical pick-up unit (OPU) is received in the chassis 12 for reading data written on an optical disk.

The cover 20 is configured for covering the chassis 12. The cover 20 includes a first surface 21 facing the top surface 11, a second surface 22 opposite to the first surface 21, and side surfaces 23 arranged between the first surface 21 and the second surface 22.

In the present embodiment, the two pivot modules 30 are located at two ends of the main body 10, respectively. Each of the pivot modules 30 includes a holder 31, a pivot 32, a connecting portion 33, and a torsion spring 34. The holder 31 is arranged on the main body 10 and defines holes 312 at two opposite sides thereof for receiving the corresponding pivot 32. The connecting portion 33 includes a first portion 331 connected to the cover 20, and a second portion 332 connected to the pivot 32. In the present embodiment, the first portion 331 and the second portion 332 cooperatively form an acute angle and an opening facing the side surface 23. In the present embodiment, the first portion 331 and the second portion 332 are integrally formed as a single monolithic piece. The pivot module 30 further includes a number of reinforcing ribs arranged between the first portion 331 and the second portion 332. Two opposite ends of the torsion spring 34 are respectively fixed on the main body 10 and the cover 20.

Referring to FIGS. 5 to 8 also, in the present embodiment, each deceleration module 40 includes a first deceleration portion 41, a second deceleration portion 42, and a bracket 43. The bracket 43 has an approximately U-shaped configuration, and includes two opposite sidewalls 431. In the present embodiment, the bracket 43 is fixed on the main body 10 and engages with the connecting portion 33. The connecting portion 33 is received in an opening of the bracket 43 when the cover 20 is rotated to a predetermined angle relative to the main body 10.

In the present embodiment, the first deceleration portion 41 includes two projections arranged on the sidewalls 431, respectively. Each of the projections includes a first inclined surface 411 (see FIG. 4). The second deceleration portion 42 includes two elongated plates respectively arranged on side surfaces of the second portion 332. Each of the elongated plates includes a second inclined surface 421 corresponding to the first inclined surface 411. The first inclined surface 411 of the first deceleration portion 41 engages with the second inclined surface 421 of the second deceleration portion 42 when the cover 20 is opened at a predetermined angle, generally in a range from 30 degrees to 50 degrees. The first and second deceleration portions 41, 42 are made of flexible material, such as polyoxymethylene (POM).

When the cover 20 is covered on the chassis 12, the first deceleration portion 41 is separated from the second deceleration portion 42. When the cover 20 is opened and rotated to a predetermined angle relative to the main body 10, the first inclined surface 411 contacts and resists the second inclined surface 421 under frictional forces. The frictional forces acts against the force of the torsion spring 34; therefore, the speed of the cover opening can be reduced. It can be understood that the predetermined angle can be changed via adjusting the positions and the material of the first and second deceleration portion 41, 42.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An optical disk player comprising:
a main body;
a cover engaging with the main body;
a pivot module, the pivot module comprising a torsion spring, two ends of the torsion spring being fixed on the main body and the cover respectively; and
a deceleration module, the deceleration module comprising a first deceleration portion arranged on the main body and a second deceleration portion arranged on the pivot module, the first deceleration portion contacting the second deceleration portion and frictional forces therebetween reduces the speed of opening the cover.

2. The optical disk player of claim 1, wherein the first deceleration portion comprises two projections.

3. The optical disk player of claim 2, wherein the second deceleration portion comprises two elongated plates.

4. The optical disk player of claim 1, wherein the pivot module further comprises a holder, a pivot and a connecting portion, the holder being fixed on the main body, the cover being connected to the pivot via the connecting portion.

5. The optical disk player of claim 4, wherein the deceleration module further comprises a bracket fixed on the main body, the first deceleration portion being arranged on the bracket, the second deceleration portion being arranged on the connecting portion.

6. The optical disk player of claim 5, wherein the bracket has a U-shaped configuration and comprises two opposite side walls, the first deceleration portion comprising two projections respectively arranged on the side walls.

7. The optical disk player of claim 6, wherein the second deceleration portion is arranged on two opposite side surfaces of the connecting portion.

8. The optical disk player of claim 1, wherein the first and second deceleration portions are made of flexible materials.

9. The optical disk player of claim 1, wherein the first and second deceleration portion are made of polyoxymethylene.

10. The optical disk player of claim 1, wherein the first deceleration portion comprises a first inclined surface, the second deceleration portion comprising a second corresponding inclined surface, the first inclined surface of the first deceleration portion contacting and resisting the second inclined surface of the second deceleration portion and frictional forces therebetween reduces the speed of opening the cover.

11. The optical disk player of claim 1, wherein when the cover and the main body cooperatively define an angle in range from 30 degrees to 50 degrees, the first deceleration portion contacting and resisting the second deceleration portion.

12. An optical disk player comprising:
a main body;
a cover engaging with the main body;
a pivot module, the pivot module comprising a holder, a pivot, a connecting portion and a torsion spring, the holder being fixed on the main body, the cover being connected to the pivot via the connecting portion, two ends of the torsion spring being fixed on the main body and the cover respectively; and
a deceleration module, the deceleration module comprising a bracket arranged on the main body and engaging with the connecting portion, a first deceleration portion arranged on the bracket and a second deceleration portion arrange on the connecting portion, the first deceleration portion contacting the second deceleration portion and frictional forces therebetween, the frictional forces acting against the force of the torsion spring.

13. The optical disk player of claim 12, wherein the bracket has a U-shaped configuration and comprises two opposite side walls, the first deceleration portion comprising two projections respectively arranged on the side walls.

14. The optical disk player of claim 12, wherein the second deceleration portion comprises two elongated plates arranged on two opposite side surfaces of the connecting portion.

15. The optical disk player of claim 12, wherein the first and second deceleration portion are made of flexible materials.

16. The optical disk player of claim 12, wherein the first and second deceleration portion are made of polyoxymethylene.

* * * * *